(12) United States Patent
Mizokami

(10) Patent No.: US 8,895,869 B2
(45) Date of Patent: Nov. 25, 2014

(54) MOUNTING STRUCTURE OF ELECTRONIC COMPONENT

(75) Inventor: Toshifumi Mizokami, Minowa-machi (JP)

(73) Assignee: Koa Corporation, Ina-shi, Nagano (JP)

( * ) Notice: Subject to any disclaimer, the term of this patent is extended or adjusted under 35 U.S.C. 154(b) by 227 days.

(21) Appl. No.: 13/517,044

(22) PCT Filed: Nov. 9, 2010

(86) PCT No.: PCT/JP2010/069895
§ 371 (c)(1),
(2), (4) Date: Aug. 27, 2012

(87) PCT Pub. No.: WO2011/074351
PCT Pub. Date: Jun. 23, 2011

(65) Prior Publication Data
US 2012/0305302 A1 Dec. 6, 2012

(30) Foreign Application Priority Data
Dec. 17, 2009 (JP) ................................. 2009-286587

(51) Int. Cl.
*H05K 1/02* (2006.01)
*H01C 1/148* (2006.01)
*H05K 3/32* (2006.01)
*H01G 2/02* (2006.01)
*H01C 1/01* (2006.01)

(52) U.S. Cl.
CPC ...... *H01C 1/148* (2013.01); *H05K 2201/10022* (2013.01); *H05K 3/321* (2013.01); *H01G 2/02* (2013.01); *H01C 1/01* (2013.01); *H05K 2201/10636* (2013.01)
USPC ........ 174/259; 174/534; 174/257; 361/321.2; 361/301.1; 216/13; 252/500

(58) Field of Classification Search
CPC .......... H05K 2201/03; H05K 2203/00; H05K 2203/03; H05K 2203/1388; H05K 3/00; H05K 3/0011; H05K 3/245; H05K 3/303; H05K 3/32; H05K 3/321; H05K 3/34; H05K 3/3489; H05K 3/36; H05K 3/382; H05K 1/03; H05K 1/09; H05K 1/11; H05K 3/007; H05K 2201/10022; H05K 2201/10636; H01L 24/26; H01L 24/27; H01L 27/13; H01L 28/00; H01L 27/01; H01C 1/01; H01C 1/148; H01G 2/02
See application file for complete search history.

(56) References Cited

U.S. PATENT DOCUMENTS 5,458,907 A * 10/1995 Ishido .............................. 216/13
6,842,329 B2 * 1/2005 Feltz et al. .................. 361/321.2
(Continued)

FOREIGN PATENT DOCUMENTS

JP 6-237069 * 8/1994
JP 07-041146 Y 9/1995
(Continued)

OTHER PUBLICATIONS

Ishidou, Kiminori,Manufacture of Printed Wiring Board, Aug. 23, 1994, JP02637069 (English Abstract).*
(Continued)

*Primary Examiner* — Timothy Thompson
*Assistant Examiner* — Michael F McAllister
(74) *Attorney, Agent, or Firm* — Smith Patent Office

(57) ABSTRACT

Electrode protective films 13a and 13b are formed on the surface of the metal layer using imidazole preflux, as terminal electrodes 35a and 35b of an electronic component. The terminal electrodes of an electronic component on which the protective films are formed are fixed by electroconductive adhesives 33a and 33b supplied to mounting lands 40a and 40b. Thereby an electronic component mounting structure without change in resistance caused by electroconductive adhesives is provided.

3 Claims, 3 Drawing Sheets

(56) References Cited

U.S. PATENT DOCUMENTS

| | | | |
|---|---|---|---|
| 6,946,601 B1 * | 9/2005 | Lee et al. | 174/534 |
| 7,258,819 B2 * | 8/2007 | Harris, IV | 252/500 |
| 2005/0017373 A1 * | 1/2005 | Nishikawa et al. | 257/778 |
| 2008/0236873 A1 * | 10/2008 | Kuwajima | 174/257 |
| 2009/0316329 A1 * | 12/2009 | Nomura | 361/301.1 |

FOREIGN PATENT DOCUMENTS

| | | |
|---|---|---|
| JP | 2002-343668 A | 11/2002 |
| JP | 2003-249401 A | 9/2003 |
| JP | 2003-309373 A | 10/2003 |
| JP | 2006-156851 A | 6/2006 |
| JP | 2007-308776 A | 11/2007 |
| WO | 2006-126551 A1 | 11/2006 |

OTHER PUBLICATIONS

International Search Report, directed to International Patent Application No. PCT/JP2010/069895, 5 pages including English translation.

* cited by examiner

MOUNTING STRUCTURE OF ELECTRONIC COMPONENT

TECHNICAL FIELD

The present invention relates to an electronic component mounting structure in which terminal electrodes of an electronic component are fixed to mounting lands on a substrate using an electroconductive adhesive.

BACKGROUND ART

As a result of recent heightened consciousness of environmental consequences in the industrial circles, technical development for mounting electronic components that have used materials not containing any lead has been progressing in the electronics field, for example. Mounting using lead-free solder or an electroconductive adhesive, for example, is under consideration as a lead-free mounting technology. More specifically, advantages such that the electroconductive adhesive is stress-resistant and use of a low heating temperature in the mounting process is possible are expected and draw attention.

A typical electroconductive adhesive has metallic particles dispersed as a conductive filler in resin components. Mounting an electronic component is carried out by supplying an electroconductive adhesive on to lands provided on a substrate, placing the electronic component thereupon, and then heat hardening the resin. Through this process, conduction is acquired through contact among the metallic particles within the resin due to constriction of the resin or contact between the metallic particles and component electrodes or substrate electrodes, and junctions thereof are bonded together by the resin. In this process, the hardening temperature of the resin used in the electroconductive adhesive is generally approximately 150° C. (degrees Centigrade), which is low in comparison to solder requiring a melting temperature of approximately 230° C. to 240° C. As a result, inexpensive other members with low heat resistance may be used as materials for constituting the mounted component and electronic circuit products, and may reduce product cost on the whole.

In place of the conventional solder, a technology for mounting an electronic component using an electroconductive adhesive is illustrated in Patent Document 1 (JP 2002-343668 A), for example. Patent Document 1 discloses a technology for forming a metal alloy layer including Cr, Co, or the like in terminal electrodes as an approach to the problem that peeling occurs at the interface of the electroconductive adhesive and tin plate electrodes when connecting an electronic component including the tin plate electrodes using the electroconductive adhesive.

DISCLOSURE OF THE INVENTION

While amounting body of an electronic component mounted using the aforementioned electroconductive adhesive may have improved bond strength over that using an electronic component of a solder plate electrode or a tin plate electrode based on the conventional technology, there is a problem that change in resistance occurs in connection between a resin Ag-type electroconductive adhesive and an electrode coated with tin (Sn).

The present invention has been devised with consideration of the above problem, and an object thereof is to provide an electronic component mounting structure capable of mounting at a low cost without causing any change in resistance even when mounting an electronic component or the like on a circuit board using an electroconductive adhesive.

The present invention has the following configuration as means for achieving the above object and resolving the aforementioned problem. In other words, the present invention is characterized by an electronic component mounting structure having a configuration in which an electroconductive adhesive made of a resin containing a conductive filler is supplied to a circuit board on which is formed a mounting land and a wiring pattern, and a terminal electrode of an electronic component is connected to the mounting land via the electroconductive adhesive. The terminal electrode comprises a metal layer made of copper and an electrode protective film formed on the surface of the metal layer using imidazole preflux.

For example, it is characterized in that the electronic component includes an insulating board, an electrical element formed on the insulating board and expressing a predetermined electric characteristic, an internal electrode connected to the electrical element, and an element protective film covering the electrical element, and the terminal electrode and the internal electrode are electrically connected. Moreover, it is characterized in that the metal layer is formed through electrolytic plating, for example. Furthermore, for example, it is characterized in that the electrical element is a resistive element, and the electronic component is a resistor.

According to the present invention, an electronic component mounting structure at a low cost without any change in resistance even when mounting an electronic component on a circuit board using an electroconductive adhesive is possible.

BEST MODE FOR CARRYING OUT THE INVENTION

Figure 1:
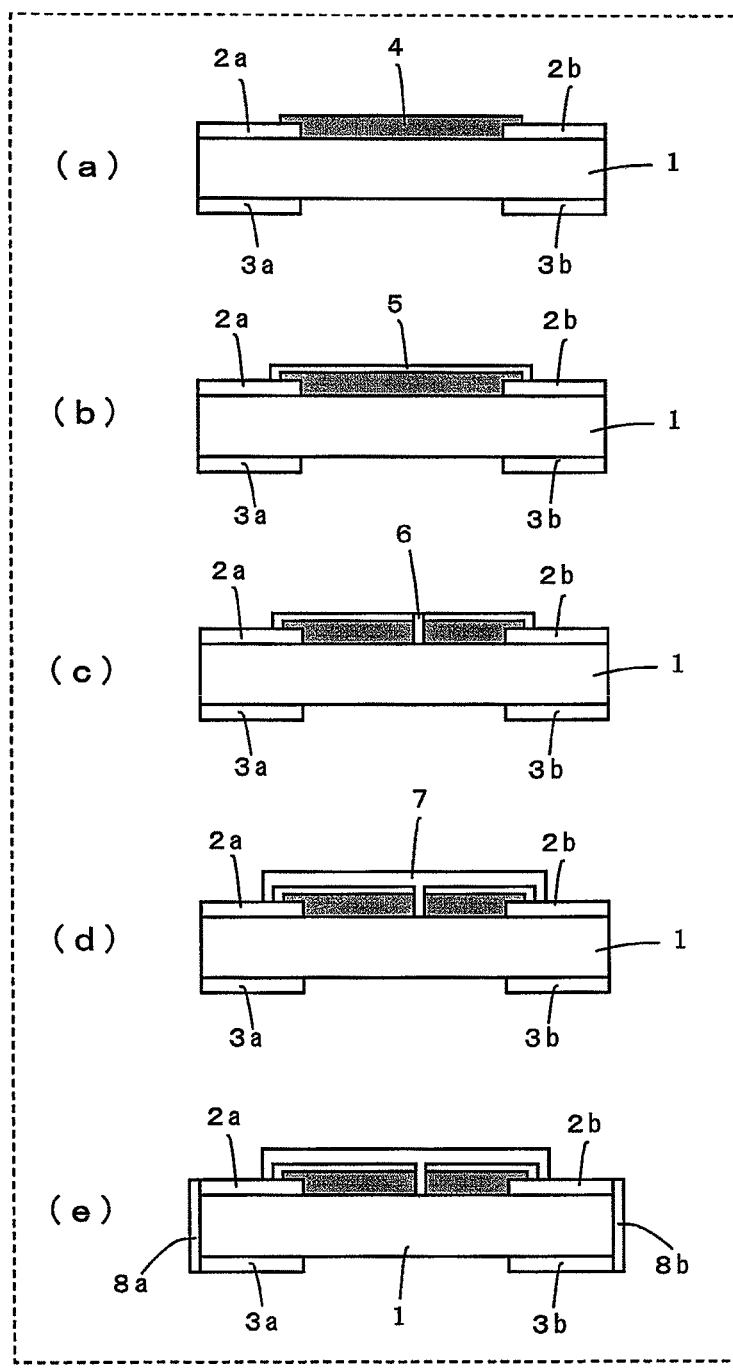
FIG. 1 is a diagram showing a part (1 of 2) of a manufacturing process for an electronic component to be mounted based on an electronic component mounting structure, according to an embodiment of the present invention.
Figure 2:
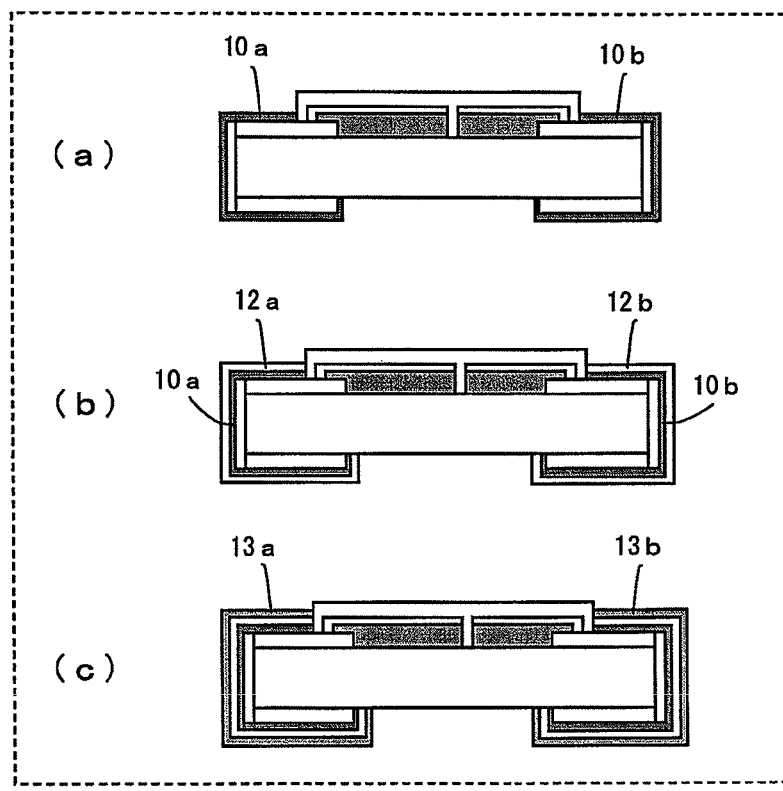
FIG. 2 is a diagram showing a part (2 of 2) of the manufacturing process for an electronic component to be mounted based on the electronic component mounting structure, according to the embodiment of the present invention.

An embodiment of the present invention is explained with reference to appended drawings hereafter. An electronic component to be mounted in an electronic component mounting structure according to the embodiment of the present invention will be described first. FIGS. 1 and 2 are illustrative of a manufacturing process for the electronic component to be mounted based on the electronic component mounting structure according to this embodiment. In the first step shown in FIG. 1(a), an Ag or Ag—Pd conductive paste, for example, is screen printed on the front and the back of an insulating substrate 1 made of alumina or the like so as to form upper internal electrodes 2a and 2b and lower internal electrodes 3a and 3b. A resistive paste made of $RuO_2$ or the like is then screen printed between the upper internal electrodes 2a and 2b so as to form a resistive element 4 therebetween.

In the step shown in FIG. 1(b), a glass paste is screen printed on the resistive element 4 so as to form a primary protective film 5 coating the resistive element 4. In the following step, a laser is irradiated so as to cut the primary protective film 5 and the resistive element 4, thereby adjusting the resistance. Through such a cutting step, a trimming mark 6 is formed on a component element, as shown in FIG. 1(c). A secondary protective film 7 is then formed using epoxy resin, for example, in the step shown in FIG. 1(d). Furthermore, as shown in FIG. 1(e), internal end face electrodes 8a and 8b are formed on end faces of the component element, and are connected to the upper internal electrodes 2a and 2b and the lower internal electrodes 3a and 3b. While the internal end face electrodes 8a and 8b are Ni—Cr films formed by sputtering or the like, they are not limited thereto, and may be formed by immersion in a conductive paste or similar method. Note that element protective film means either the primary protective film 5 or the secondary protective film 7 or both.

In the step shown in FIG. 2(a), primary terminal electrodes 10a and 10b made of Ni are formed on ends of the component element through electrolytic plating, for example. Secondary terminal electrodes 12a and 12b made of Cu are then formed through electrolytic plating in the subsequent step of FIG. 2(b). Electrolytic plating may employ any one of a copper sulfate bath, a copper fluoroborate bath, a copper cyanide bath, a copper pyrophosphate bath, or the like. Moreover, thickness of the secondary terminal electrodes 12a and 12b is approximately 3 to 12 μm, for example.

In the step of FIG. 2(c), the element of the electronic component is immersed in preflux, for example, so as to form electrode protective films 13a and 13b on surfaces of the secondary terminal electrodes 12a and 12b. This preflux is imidazole water-soluble preflux, and is an aqueous solution made of an imidazole compound and other additives. Use of a preflux having copper selectivity is preferred. Water-soluble preflux 'Tough Ace F2' ('Tough Ace' is a registered trademark of Shikoku Chemicals Corporation) manufactured by Shikoku Chemicals Corporation is used in this embodiment. Note that other than immersion, contact of the preflux on the secondary terminal electrodes 12a and 12b is established through spraying, coating, and the like.

As such, making the preflux have contact with the secondary terminal electrodes 12a and 12b results in complex bonding of the copper and the imidazole compound and thereby forming the electrode protective films 13a and 13b approximately 0.1 to 0.5 μm in thickness, for example, on the surfaces of the secondary terminal electrodes 12a and 12b. The electrode protective films 13a and 13b have an antirust effect.

Figure 3:
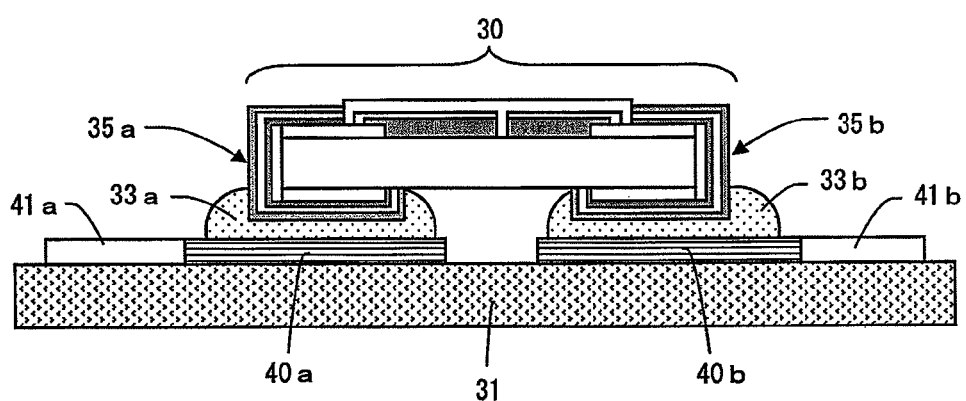
FIG. 3 is a diagram illustrative of a specific example of the electronic component mounting structure, according to the embodiment of the present invention.

The electronic component mounting structure according to this embodiment will be described next. FIG. 3 illustrates a specific example of the electronic component mounting structure according to an embodiment of the present invention. As shown in FIG. 3, electroconductive adhesives 33a and 33b are supplied via a dispenser or the like, for example, onto mounting lands 40a and 40b, which are connected to wiring patterns 41a and 41b, respectively, that are deployed on a circuit board 31. Terminal electrodes 35a and 35b on which the aforementioned electrode protective films 13a and 13b are formed are then aligned with the mounting lands 40a and 40b, respectively, so as to load and fix an electronic component 30 thereupon. The electroconductive adhesives 33a and 33b include epoxy resin, acid anhydride, phenolic resin, an accelerating agent, and a conductive filler, for example, where the conductive filler is made of Ag, for example.

Once the electronic component 30 is loaded as such, it is heated to 100° C. to 200° C. to harden the electroconductive adhesives 33a and 33b. Note that conducting a heat treatment in a nitrogen ($N_2$) atmosphere is also effective in preventing further Cu oxidation.

Figure 4:
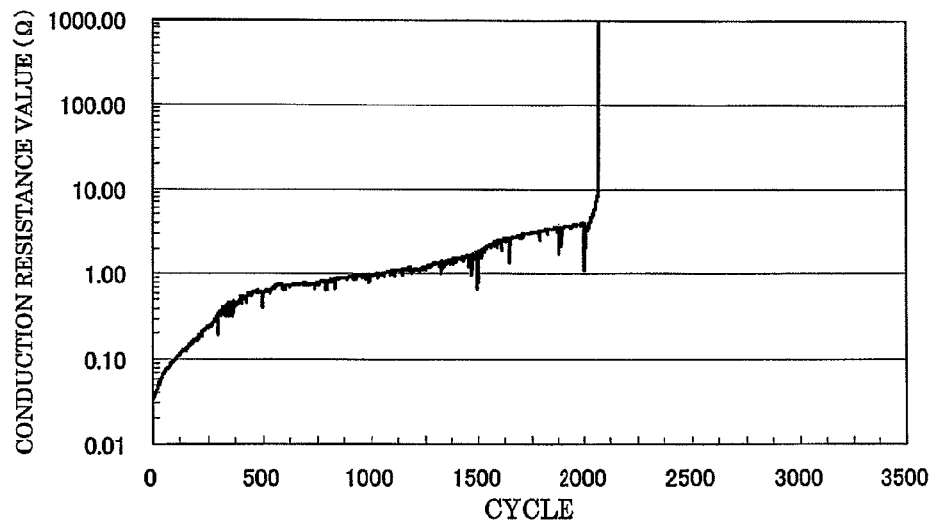
FIG. 4 is a graph showing change in resistance when a conventional resistor including Sn-plated end face electrodes is mounted on a circuit board using an electroconductive adhesive.

Test results of electrical performance of electrodes of the electronic component mounting structure according to this embodiment will be described next. FIG. 4 illustrates change in resistance when a resistor having a conventional configuration and Sn-plated end face electrodes is mounted on a circuit board using an electroconductive adhesive including an Ag filler, and has undergone a temperature cycle test (−40° C. to 125° C.). In this case, such change in resistance as shown in FIG. 4 has occurred, leading to an open state where the electric connection is severed. Such change in resistance is considered to be caused by dispersion of Sn into the Ag filler included in the electroconductive adhesive, galvanic corrosion due to water absorbed into the resin components, and the like.

Figure 5:
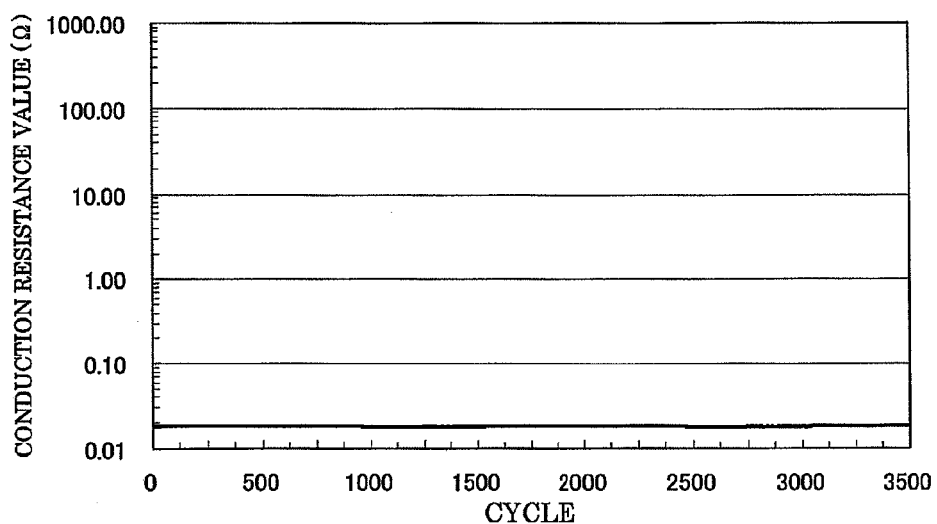
FIG. 5 is a graph showing results of a temperature cycle test for the electronic component, according to the embodiment of the present invention.

FIG. 5 is a graph showing results of a temperature cycle test for the electronic component mounting structure according to the embodiment, as in the case of FIG. 4. Upon conducting an electrical performance test on the electronic component structure according to this embodiment, namely, the electronic component mounting structure of FIG. 3, electrically stable conduction characteristics are attained without any outstanding change in resistance as shown in FIG. 5.

Note that while a surface-mounted resistor (more specifically, a fixed resistor with little change in resistance with respect to environmental variation) has been described in the above embodiment, the electronic component mounting structure according to the present invention is not limited thereto, and is also applicable to capacitors, inductors, varistors, thermistors, fuses, and the like, for example, in addition to the surface-mounted electronic components.

Regarding inductors, thermistors, and fuses of the electronic components, inductors may be formed by replacing for the resistive element of the aforementioned resistor a coil pattern formed on the substrate using a conducting film; thermistors may be formed by replacing for the same a thermistor element, which changes its own resistance in accordance with change in temperature; and fuses may be formed by replacing for the same a conducting film including a fusible element, which breaks due to concentrated current load etc.; thereby attaining the respective basic configurations thereof. An electrical element refers to an element that expresses predetermined electrical characteristics, such as a resistive element formed on a substrate, a coil pattern in a spiral form made up of a conducting film, a thermistor element that changes its own resistance in accordance with change in temperature, or a conducting film including a fusible element, which breaks due to concentrated current load.

Meanwhile, regarding capacitors and varistors, the end face electrodes maybe formed by immersing end faces of a capacitor element assembly and a varistor element assembly in a conductive paste containing Cu and calcinating them at a temperature of approximately 800° C. Such a configuration also attains the same results as the present invention by forming electrode protective films on metal layer surfaces using imidazole preflux. However, with the resistor, a problem of change in resistance occurs when exposed to high temperature in steps after formation of the resistive element. Therefore, forming end face electrodes by electrolytic plating as in the above embodiment is preferred. Note that the end face electrodes may also be formed through electroless plating.

As described above, according to the embodiments, an electronic component having an electrode protective film formed on surfaces of end face electrodes (metal layers) using imidazole preflux is aligned with and mounted on lands deployed on a circuit board with the use of an electroconductive adhesive, thereby attaining the results of not causing change in resistance at junctions. Moreover, members for mounting a component, including an electroconductive adhesive, with low heat resistance maybe used, thereby allowing provision of an electronic component mounting structure with an overall low cost.

Industrial Applicability

The present invention is applicable to an electronic component mounting structure that does not cause change in resistance at junctions even if an electronic component or the like is mounted on a circuit board using an electroconductive adhesive and can mount the electronic component at a low cost.

The invention claimed is:

1. An electronic component mounting structure having a configuration in which an electroconductive adhesive made of a resin containing a conductive filler is supplied to a circuit board on which is formed a mounting land and a wiring pattern, and a terminal electrode of an electronic component is connected to the mounting land via the electroconductive adhesive, wherein
the terminal electrode comprises a metal layer made of electrolytic-plated copper and an electrode protective film formed on the surface of the metal layer and on the outermost surface of the terminal electrode using imidazole preflux which forms a complex with copper, where the terminal electrode is fixed on the mounting land while maintaining a conductivity at a junction of the electrode protective film and the electroconductive adhesive.

2. The electronic component mounting structure according to claim 1, wherein the electronic component comprises an insulating board, an electrical element formed on the insulating board having a predetermined electric characteristic, an internal electrode connected to the electrical element, and an element protective film covering the electrical element, wherein the terminal electrode and the internal electrode are electrically connected.

3. The electronic component mounting structure according to claim 2, wherein the electrical element is a resistive element, and the electronic component is a resistor.

* * * * *